United States Patent
Allen et al.

(10) Patent No.: US 6,955,512 B2
(45) Date of Patent: Oct. 18, 2005

(54) MOUNTING DEVICE FOR SECURING AN ELECTRONIC DEVICE TO AN EQUIPMENT RACK

(75) Inventors: Joseph R. Allen, Tomball, TX (US); Kelly K. Smith, Spring, TX (US); George D. Megason, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 32 days.

(21) Appl. No.: 10/624,718

(22) Filed: Jul. 21, 2003

(65) Prior Publication Data

US 2005/0019133 A1 Jan. 27, 2005

(51) Int. Cl.[7] ............................................. F16B 21/18
(52) U.S. Cl. ...................................... 411/353; 211/26
(58) Field of Search .................. 211/26; 411/352–353, 411/999, 522–524, 529

(56) References Cited

U.S. PATENT DOCUMENTS

| | | | |
|---|---|---|---|
| 665,272 A * | 1/1901 | Schendel .................... 411/120 |
| 1,513,710 A * | 10/1924 | Lewis ......................... 24/676 |
| 1,976,623 A * | 10/1934 | Monroe et al. ............... 81/3.4 |
| 2,919,736 A * | 1/1960 | Kann .......................... 411/353 |
| 2,948,317 A * | 8/1960 | Munro ........................ 411/352 |
| 2,967,557 A * | 1/1961 | Tait et al. ................... 411/349 |
| 3,138,188 A * | 6/1964 | Tuozzo et al. .............. 411/353 |
| 3,314,696 A * | 4/1967 | Ferguson et al. ...... 285/148.14 |
| 3,346,032 A * | 10/1967 | Gulistan ..................... 411/349 |
| 3,560,027 A * | 2/1971 | Graham ................... 285/130.1 |
| 3,564,563 A * | 2/1971 | Trotter et al. .............. 411/552 |
| 4,244,608 A * | 1/1981 | Stuemky ..................... 285/305 |
| 4,352,586 A * | 10/1982 | Hayden ...................... 403/163 |
| 4,464,090 A * | 8/1984 | Duran ......................... 411/103 |
| 4,505,058 A * | 3/1985 | Peterson ..................... 37/459 |
| 4,561,682 A * | 12/1985 | Tisserat ...................... 285/305 |
| 4,721,331 A * | 1/1988 | Lemelshtrich .............. 285/305 |
| 4,733,987 A * | 3/1988 | Tomlinson et al. ......... 403/326 |
| 4,865,280 A | 9/1989 | Wollar |
| 4,923,272 A * | 5/1990 | Cuda ........................... 385/55 |
| 5,000,614 A * | 3/1991 | Walker et al. .............. 403/326 |
| 5,123,680 A | 6/1992 | Liu |
| 5,127,764 A * | 7/1992 | Baer .......................... 403/316 |
| 5,338,139 A * | 8/1994 | Swanstrom ................. 411/353 |
| 5,382,124 A * | 1/1995 | Frattarola ................... 411/352 |
| 5,520,490 A * | 5/1996 | Perach et al. .............. 411/353 |
| 5,544,992 A * | 8/1996 | Ciobanu et al. ............ 411/353 |
| 5,586,792 A * | 12/1996 | Kalahasthy et al. ........ 285/319 |
| 5,593,187 A * | 1/1997 | Okuda et al. ............... 285/305 |
| 5,611,654 A * | 3/1997 | Frattarola et al. ........... 411/432 |
| 5,630,686 A | 5/1997 | Billmann |
| 5,704,100 A * | 1/1998 | Swan .......................... 24/656 |
| 5,865,582 A * | 2/1999 | Ellis et al. .................. 411/353 |
| 6,044,536 A * | 4/2000 | Schneider .................... 29/437 |
| 6,086,480 A * | 7/2000 | Ellis et al. ..................... 470/6 |
| 6,279,754 B1 * | 8/2001 | Hoss et al. ................... 211/26 |
| 6,364,688 B1 | 4/2002 | Froley, II et al. |

(Continued)

OTHER PUBLICATIONS http://www.rafhdwe.com/RAF_site/OnlineCatalog/EHCoverFrame.html and associated pages show state of the art captive fasteners at the time of invention.*

(Continued)

*Primary Examiner*—Robert J. Sandy
*Assistant Examiner*—Jeffrey A. Sharp (57) ABSTRACT

A mounting device for securing an electronic device to an equipment rack includes a mounting member and a securing device mounted on an end of the mounting member.

6 Claims, 9 Drawing Sheets

U.S. PATENT DOCUMENTS

| | | | |
|---|---|---|---|
| 6,468,012 B2 * | 10/2002 | Ellis et al. | 411/353 |
| 6,473,313 B1 | 10/2002 | Chen et al. | |
| 6,682,282 B2 * | 1/2004 | Allen | 411/353 |
| 2001/0024607 A1 * | 9/2001 | Frattarola | 411/107 |
| 2002/0172574 A1 * | 11/2002 | McCormack et al. | 411/352 |
| 2003/0063960 A1 * | 4/2003 | Allen | 411/107 |

OTHER PUBLICATIONS http://www.southcoipsg.com/prd/hierarchymain.Showhierarchy!par_nNodeID=1128&par_nLang_ID=0 and associated pages show state of the art captive fasteners at the time of invention.*

* cited by examiner

FIG. 12

MOUNTING DEVICE FOR SECURING AN ELECTRONIC DEVICE TO AN EQUIPMENT RACK

FIELD OF THE INVENTION

The invention relates generally to devices used for mounting an electronic unit within an equipment rack, and more particularly to a mounting device which allows a user to interchange fasteners to facilitate installation of the electronic unit within an equipment rack.

BACKGROUND OF THE INVENTION

An equipment rack may be adapted to receive and hold many types of electronic units such as, for example, media storage and read/write devices, networking devices, and telephone communications devices. After insertion of an electronic unit into an equipment rack, the electronic unit may be secured to the front panel of the equipment rack with fasteners such as screws and, more particularly, thumbscrews. An electronic unit to be installed into an equipment rack may be provided with such fasteners. However, the fasteners on the electronic unit may be incompatible with the corresponding openings in the equipment rack. That is, the equipment rack may be adapted to receive screws with a completely different thread type than the screw provided with the electronic unit, thereby making installation of the electronic unit into the equipment rack more difficult.

SUMMARY OF THE INVENTION

A mounting device for securing an electronic device to an equipment rack includes a mounting member having at least one flange, an end portion receivable within an opening in the electronic device, and an inner cylindrical portion adapted to receive fasteners having different thread types. The mounting device may also include a securing device which is adapted to secure the mounting device to the electronic device.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
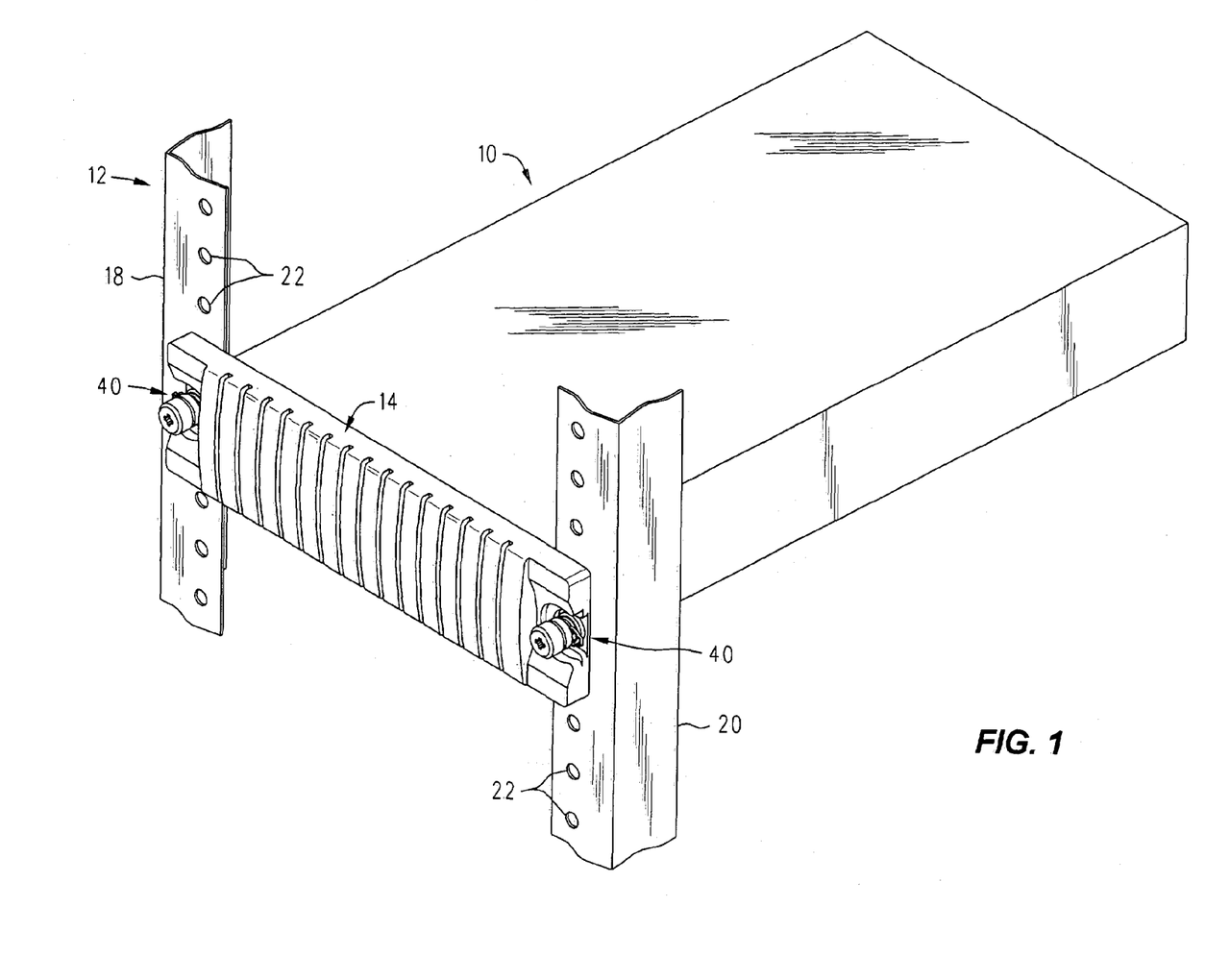
FIG. 1 is an isometric view of an electronic unit installed in a cutaway portion of an equipment rack utilizing mounting devices in accordance with an embodiment of the invention.
Figure 2:
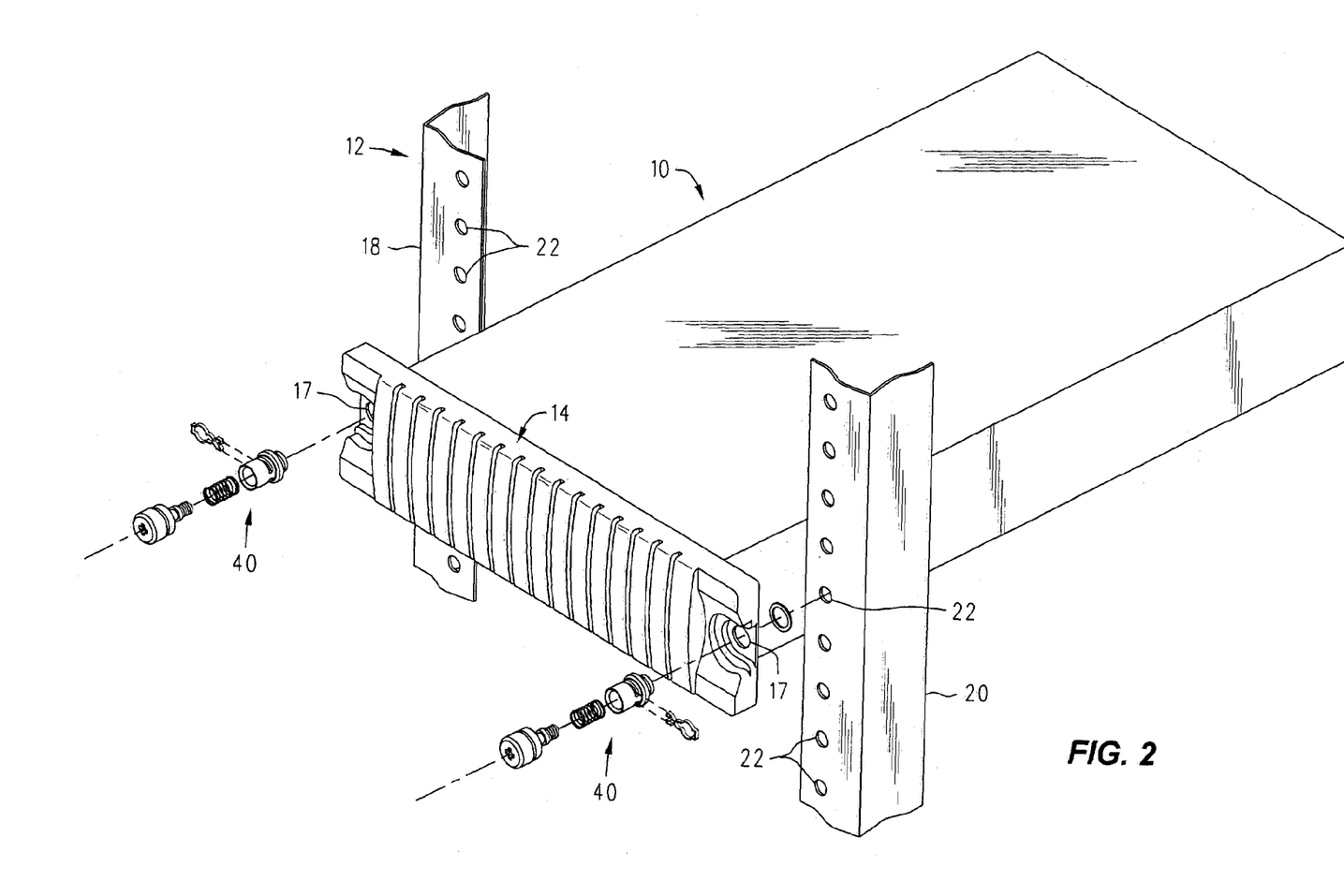
FIG. 2 is an exploded isometric view of the electronic unit, cutaway portion of the equipment rack, and mounting devices of the embodiment of FIG. 1.

FIGS. 1 and 2 illustrate an exemplary electronic unit 10 installed in an equipment rack 12 utilizing mounting devices 40 of an embodiment of the invention. The electronic unit 10 may be any type of device such as, for example, a media storage or read/write device, networking device, telephone communications device, or any other device that may be inserted into an equipment rack. The electronic device 10 may have a front panel 14 having a front surface 15, a rear surface 16, and openings 17 (FIG. 2) therein for receiving the mounting devices 40. The equipment rack 12 may have front mounting columns 18, 20, with a plurality of openings 22 therein. For illustrative purposes, only a portion of the front mounting columns 18, 20 of the equipment rack 12 is shown in FIGS. 1 and 2. As used herein, "equipment rack" is defined as any type of rack that is adapted to receive and hold a plurality of electronic units. An electronic unit 10 may come equipped with a first fastener 24, FIG. 3, such as a thumbscrew which is mounted in each of the mounting devices 40. Each of the openings 22 in the equipment rack 12 may be threaded to receive a second fastener 26, FIG. 3, such as a thumbscrew. Alternatively, each of the openings 22 may be non-threaded cutouts with clip nuts, cage nuts, or the like mounted therein. As used herein, the term "opening(s)" (17, 22) refers to the portion of the opening, clip nut, cage nut, or the like which is threaded to receive a thumbscrew.

Figure 3:
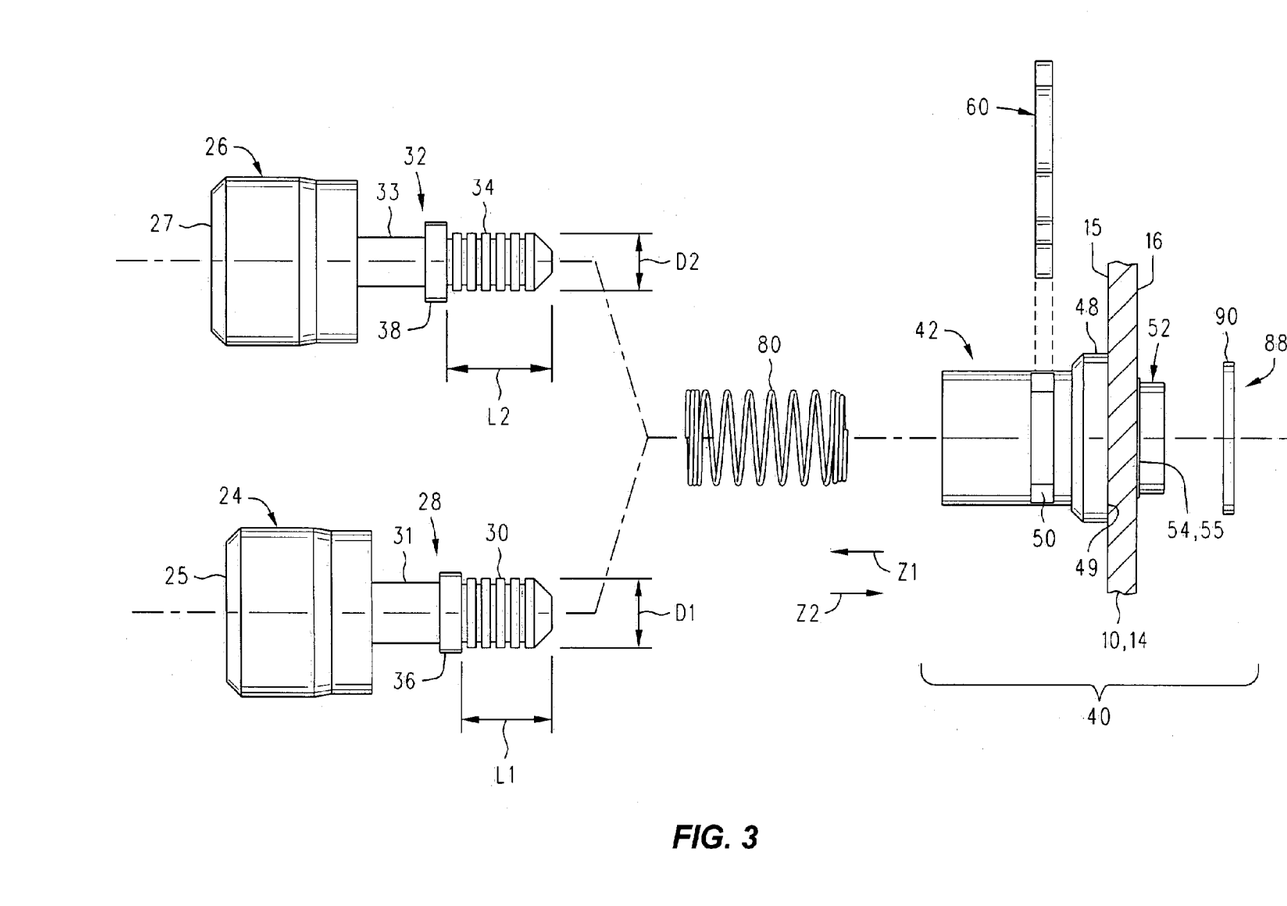
FIG. 3 is an exploded cross-sectional view of a mounting device of the embodiment of FIG. 1 mounted in an electronic unit, showing two exemplary fasteners.

As shown in FIG. 3, the first fastener 24 may be different from the second fastener 26. That is, the thread type (thread diameter and/or length) of the first fastener 24 may be different from the thread type (thread diameter and/or length) of the second fastener 26. FIG. 3 illustrates exemplary first and second fasteners 24, 26 having different thread types. The shaft 28 of the first fastener 24 may have a threaded portion 30 with a diameter of "D1" and a length of "L1". The shaft 32 of the second fastener 26 may have a threaded portion 34 with a diameter of "D2" and a length of "L2". While, in FIG. 3, "D1" appears to be larger than "D2" and "L1" appears to be shorter than "L2", it is to be understood that the threaded portions 30, 34 may have any dimensions, i.e., "D1" may be the same as, smaller, or larger than "D2" and "L1" may be the same as, shorter, or longer than "L2". As indicated by broken lines, each of these fasteners 24, 26, as well as other fasteners as described in further detail below, is adapted to be received by a mounting device 40.

Figure 4:
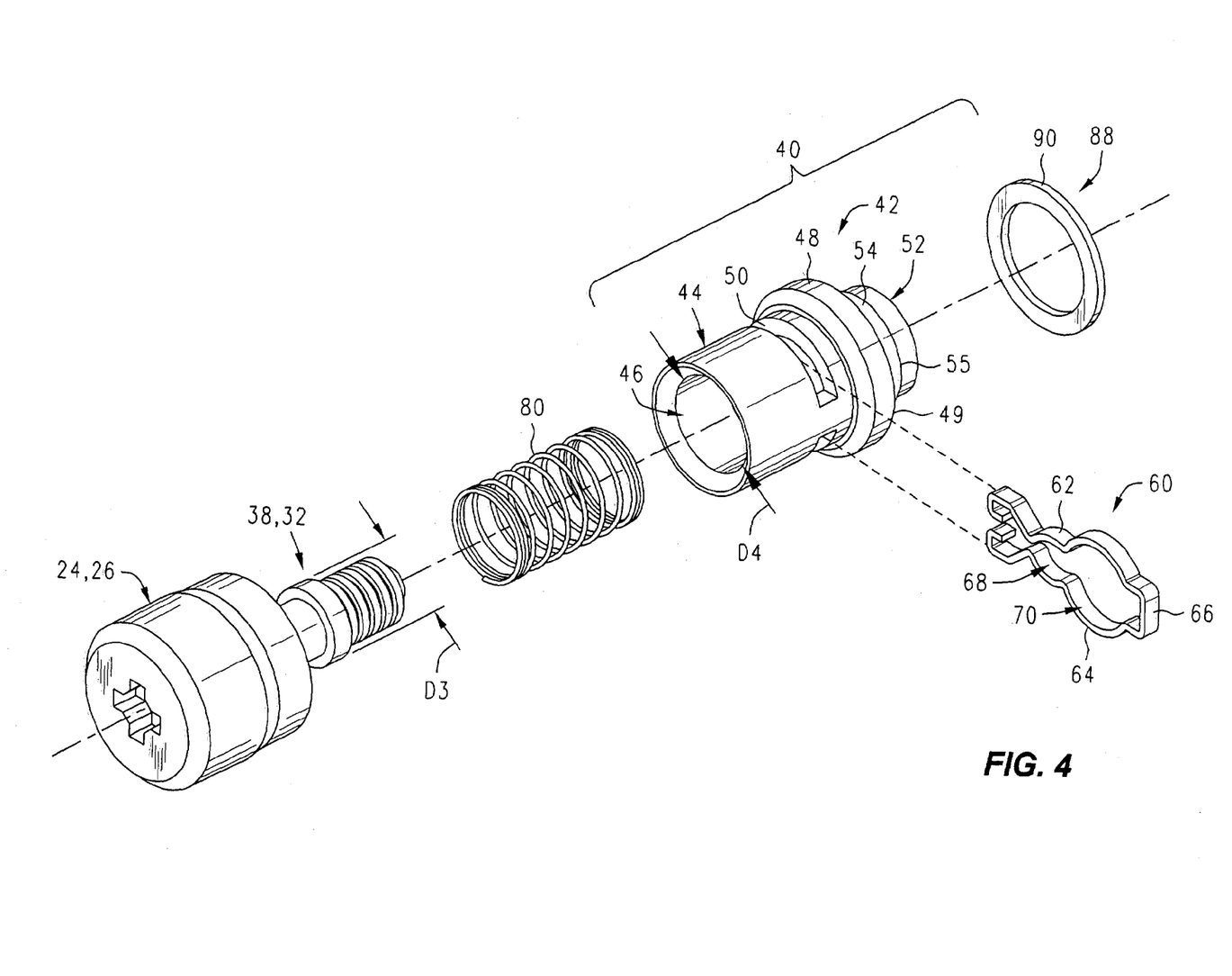
FIG. 4 is an exploded isometric view of the mounting device of the embodiment of FIG. 1 with an exemplary fastener.
Figure 5:
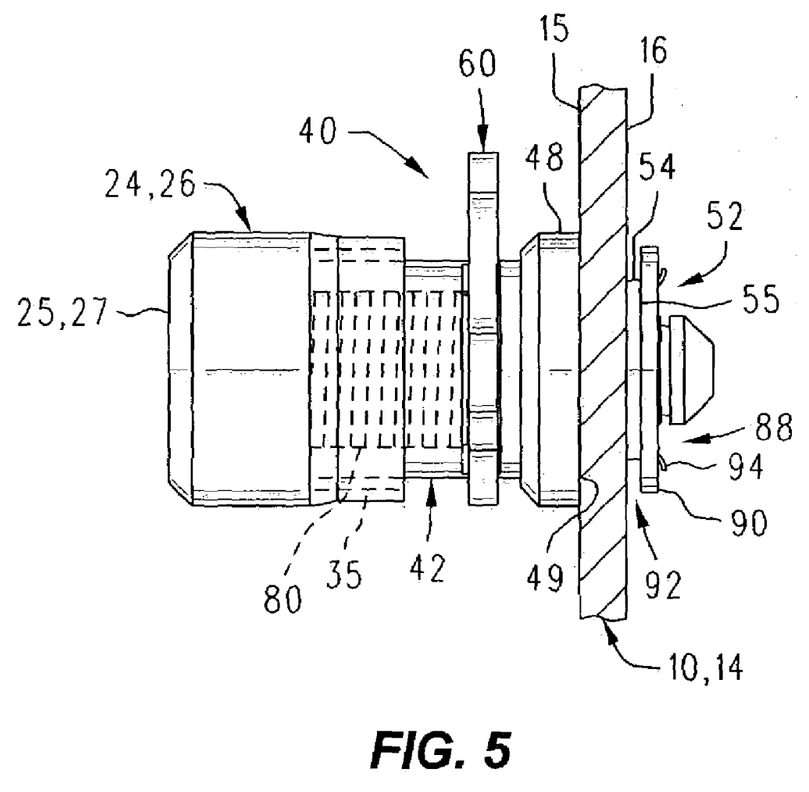
FIG. 5 is a cross-sectional view of the mounting device of the embodiment of FIG. 1 and an exemplary fastener mounted in an electronic unit.

Referring to FIGS. 3–5, the mounting device 40 may comprise a mounting member 42 having an outer portion 44 (FIG. 4) which may be cylindrical, as shown, or any other shape, and an inner cylindrical portion 46 (FIG. 4). The mounting member 41 may further comprise an opening 50, which may be a slot as shown, extending at least partially around the circumference of both the outer portion 44 and the inner cylindrical portion 46 of the mounting member 42. The outer portion 44 may have a first flange 48 having a surface 49 which is adapted to abut against the front surface 15 of the electronic device 10 front panel 14 adjacent to an opening 17 (FIG. 2). The mounting member 42 may also have an end portion 52 having a second flange 54. The end portion 52 is adapted to pass through an opening 17 in the electronic device 10 front panel 14. The diameter of the flange 54 is preferably somewhat smaller than the diameter of the opening 17 so that the mounting member 42 may have limited movement or "float" within the opening 17 as described in further detail below.

As best shown in FIG. 4, the mounting member 42 inner cylindrical portion 46 of the mounting device 40 is adapted to receive a fastener 24, 26. Each fastener 24, 26 may have a maximum diameter portion 36, 38, respectively, which may be a flange as shown in FIGS. 3 and 4, a part of the threaded portion 30, 34, or any other part of the shaft 28, 32 of the fastener 24, 26. The maximum diameter portion 36, 38 may have a diameter of "D3", FIG. 4 (which may be the same as or larger than the thread diameter "D1" or "D2", FIG. 3). As indicated in FIG. 4, the inner cylindrical portion 46 of the mounting device 40 may receive any fastener 24, 26 having a maximum diameter "D3" that is less than the diameter "D4" of the inner cylindrical portion 46. The length "L1", "L2", FIG. 3, of the threaded portion 30, 34 of the fasteners 24, 26 may be any length that can be accommodated by the equipment rack 12, FIGS. 1 and 2. In other words, the mounting device 40 is adapted to receive a fastener with a threaded portion of any length and any diameter up to "D4", FIG. 4.

The mounting device 40 may further comprise a retainer member 60 which is adapted to be received within the opening 50 in the mounting member 42 as illustrated in FIG. 5. As best shown in FIG. 4, the retainer member 60 may be a clip having a pair of resilient legs 62, 64 biased toward one another and connected by a flexible hinge 66. The retainer member 60 may have a smaller diameter portion 68 which is utilized when the retainer member 60 is in a "latched" mode and a larger diameter portion 70 which is utilized when the retainer member 60 is in an "unlatched" mode. These modes will be described in further detail below with reference to FIGS. 6–11.

Figure 6:
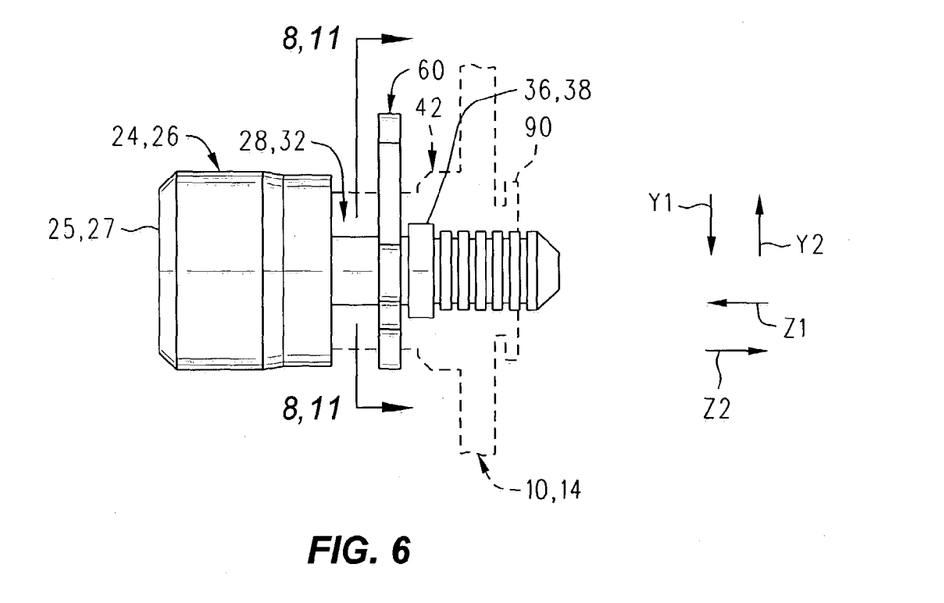
FIG. 6 is a side elevation view of an exemplary fastener and a retainer member of the mounting device of the embodiment of FIG. 1 in a "latched" mode.
Figure 7:
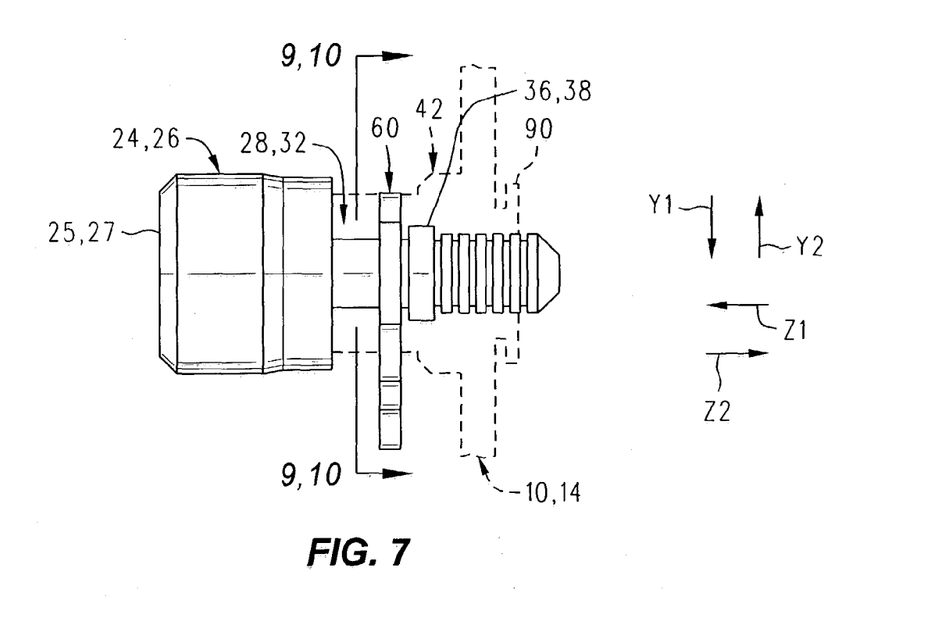
FIG. 7 is a side elevation view of an exemplary fastener and a retainer member of the mounting device of the embodiment of FIG. 1 in an "unlatched" mode.

A biasing device 80 such as a coil spring may be included which biases the fastener 24, 26 in a linear direction "Z1", FIGS. 3, 6 and 7. The biasing device 80 may be integrally attached to each fastener 24, 26 on the non-threaded portion 31, 33 thereof, or it may be a separate part as shown in FIG. 3. Whether an integral or a separate part, the biasing device 80 may be positioned on the non-threaded portion 31, 33 between the flange 36, 38 and the head 25, 27 of the fastener 24, 26. As best shown in FIG. 5, the fastener head 25, 27 may have a sleeve portion 35 within which the biasing device 80 and mounting member 42 may be nested. As described in further detail below, when the retainer member 60 is in a "latched" mode, the fastener 24, 26 may be displaced in a linear direction "Z1" or "Z2" for a limited distance. The biasing device 80 biases the fastener 24, 26 in a linear direction "Z1" so that, when not secured to an equipment rack 12 (FIG. 1), most or all of the threaded portion 30, 34 of the fastener 24, 26 may be safely stored within the mounting member 42. This prevents damage to the threaded portion 30, 34 of the fastener which could occur if it was allowed to protrude from the mounting member 42.

The mounting device 40 may further comprise a securing device 88 which is adapted to secure the mounting member 42 to the electronic device 10, FIGS. 1 and 2. The securing device 88 may comprise a retainer ring 90 which is adapted to be received on the end portion 52 of the mounting member 42. The retainer ring 90 may abut a surface 55 on the second flange 54 (the flange on the end portion 52) in order to leave a small gap 92, FIG. 5, between the retainer ring 90 and the rear surface 16 of the electronic device 10 front panel 14. The gap 92, as well as the differences in diameters of the flange 54 and opening 17 noted above, allows the mounting device 40 and fastener 26 mounted therein to have limited movement or "float" within the opening 17 in order to assist in centering the fastener 26 within an opening 22 in the equipment rack 12. The retainer ring 90 may be secured on the end portion 52 of the mounting member 42 using any conventional means, such as, for example, by pressing or swaging a ferrule 94, FIG. 5, or the like onto the end portion 52 of the mounting member 42.

As noted above, an electronic device 10 to be installed in an equipment rack 12 may be supplied with a mounting device 40 and a first fastener 24 mounted on the electronic device 10. If the first fastener 24 is not compatible with the equipment rack 12, then it can be exchanged for a compatible second fastener 26 with a different thread type than the first fastener 24. FIGS. 6–11 illustrate the "latched" and "unlatched" modes of the retainer member 60 described briefly above. For clarity in illustrating these modes, the mounting member 42, retainer ring 90, and the front panel 14 of the electronic device 10 are shown in dashed lines in FIGS. 6 and 7 and are removed entirely from FIGS. 8–11. The biasing device 80 has also been removed from FIGS. 6–11.

Figure 8:
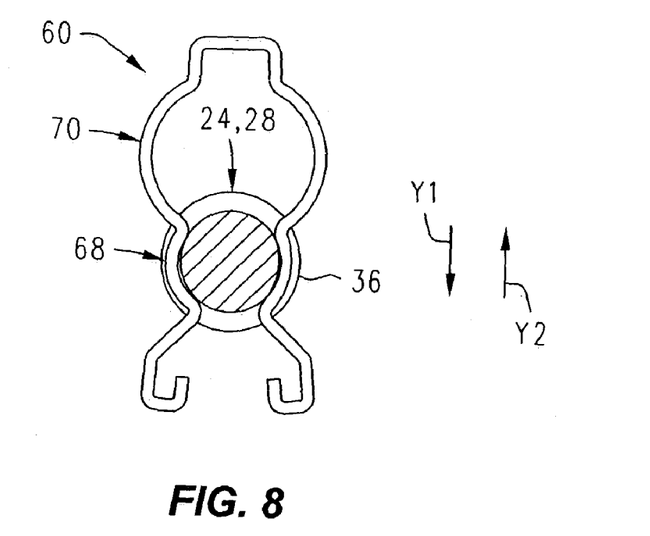
FIG. 8 is a cross-sectional view of an exemplary first fastener and retainer member of the mounting device of the embodiment of FIG. 1 in a "latched" mode.
Figure 9:
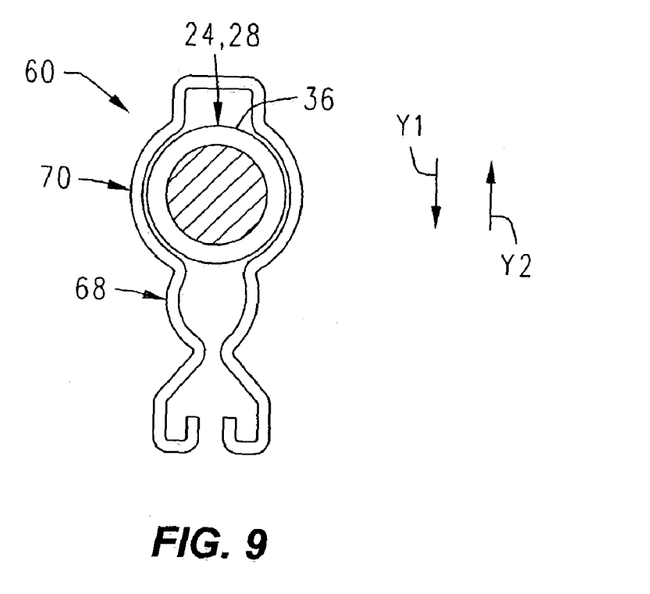
FIG. 9 is a cross-sectional view of an exemplary first fastener and retainer member of the mounting device of the embodiment of FIG. 1 in an "unlatched" mode.

In order to remove the first fastener 24 from the mounting device 40, the retainer member 60 must be removed from a "latched" mode, FIGS. 6 and 8, and put into an "unlatched" mode, FIGS. 7 and 9. In a "latched" mode, the retainer member 60 is engaged with the first fastener 24. In an "unlatched" mode, the retainer member 60 is disengaged from the first fastener 24. More specifically, as best shown in FIG. 8, the retainer member 60 is in a "latched" mode on the first fastener 24 when the smaller diameter portion 68 thereof is positioned adjacent to the shaft 28 of the fastener 24. As best shown in FIG. 9, the retainer member 60 is in an "unlatched" mode on the first fastener when the larger diameter portion 70 thereof is positioned adjacent to the shaft 28 of the fastener 24.

To remove the retainer member 60 from a "latched" mode as shown in FIGS. 6 and 8, the retainer member 60 may be translated in a first linear direction "Y1" until the larger diameter portion 70 is positioned adjacent to the shaft 28 of the first fastener 24 as best shown in FIG. 9. In this position, the maximum diameter portion (e.g., the flange 36) of the shaft 28 of the first fastener 24 may pass through the larger diameter portion 70 of the retainer member 60, and the first fastener 24 may be easily, linearly removed (i.e., whereby rotation of the fastener 24 is not necessary for removal) in direction "Z1" (FIG. 6) from the mounting member 42 of the mounting device 40. Even with the first fastener 24 removed therefrom, the mounting device 40 remains on the electronic device 10 with the assistance of the securing device 88, described above with reference to FIGS. 3–5.

Figure 10:
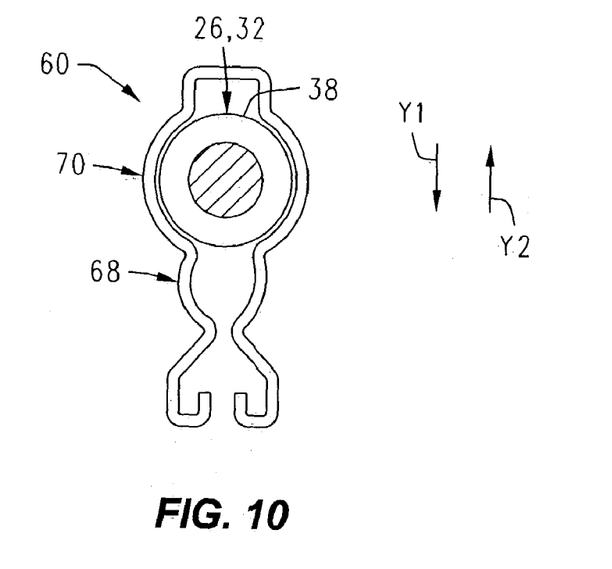
FIG. 10 is a cross-sectional view of an exemplary second fastener and retainer member of the mounting device of the embodiment of FIG. 1 in an "unlatched" mode.
Figure 11:
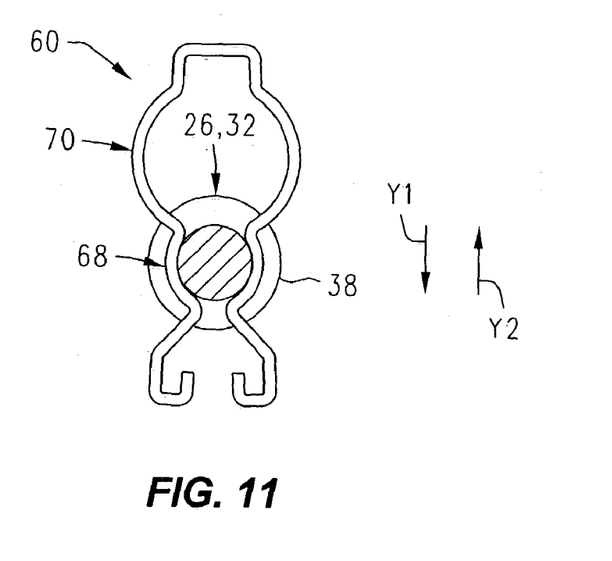
FIG. 11 is a cross-sectional view of an exemplary second fastener and retainer member of the mounting device of the embodiment of FIG. 1 in a "latched" mode.
Figure 12:
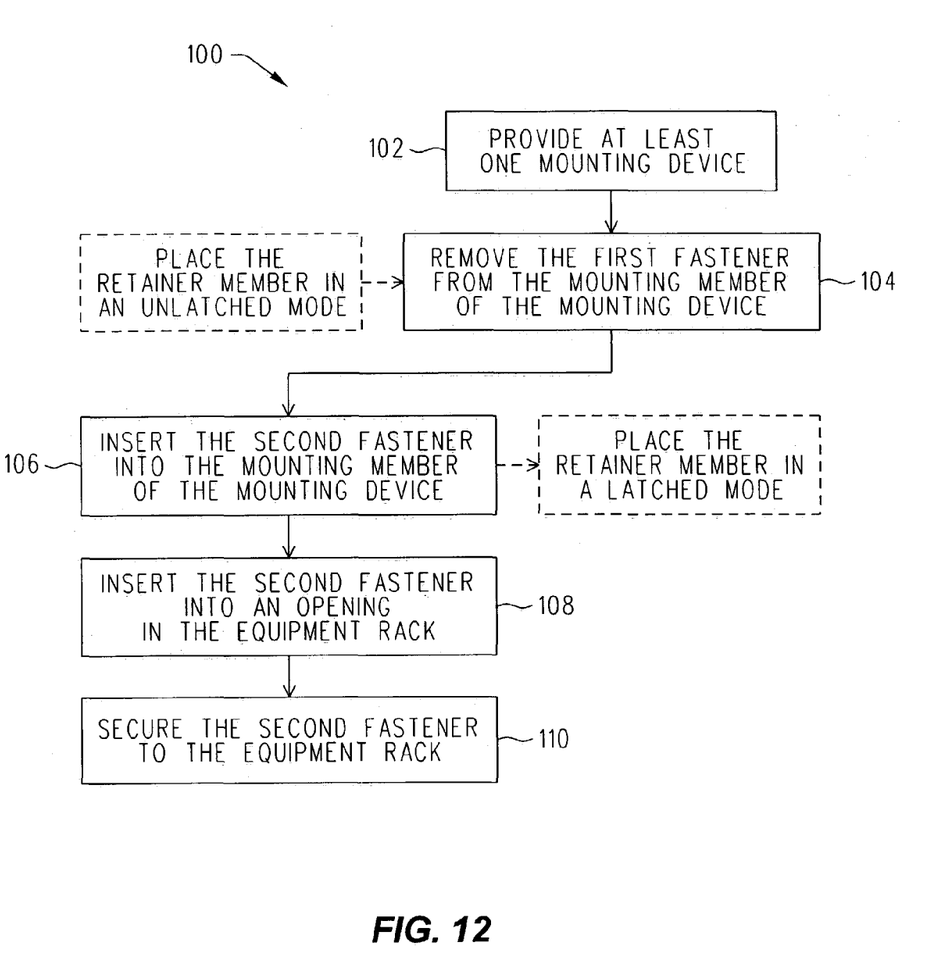
FIG. 12 is a flow chart illustrating a method of mounting an electronic device to an equipment rack utilizing one or more mounting devices in accordance with an embodiment of the invention.

With the retainer member 60 still in an "unlatched" mode and with the mounting device 40 mounted on the electronic device 10, a second fastener 26 may then be inserted in direction "Z2" into the mounting device 40 (and, specifically, a second fastener 26 may be inserted into the opening 52 in the mounting member 42 of the mounting device 40, FIG. 4) as shown in FIG. 10. In an "unlatched" mode, the retainer member 60 is disengaged from the second fastener 26. More specifically, as best shown in FIG. 10, the retainer member 60 is in an "unlatched" mode on the second fastener 26 when the larger diameter portion 70 of the retainer member 60 is positioned adjacent to the shaft 32 of the fastener 26. The retainer member 60 may then be returned to a "latched" mode, whereby the retainer member 60 is engaged with the second fastener 26, by translating the retainer member 60 in a second linear direction "Y2" opposite the first linear direction "Y1" until the smaller diameter portion 68 is positioned adjacent to the shaft 32 of the second fastener 26 as shown in FIG. 11. In this mode, the second fastener 26 cannot be pulled out of mounting member 42 since the smaller diameter portion 68 of the retainer member 60 will abut the maximum diameter portion (e.g., the flange 38) of the shaft 32. In other words, in the "latched" mode, the second fastener 26 cannot be linearly removed from the mounting member 42 of the mounting device 40. With the retainer member 60 in the "latched" mode, the second fastener 26, mounting device 40, and electronic device 10 may then be mounted on the equipment rack 12. As noted above, due to the gap 92 (FIG. 5) between the retainer ring 90 and the rear surface 16 of the electronic device 10 front panel 14, the mounting device 40 and fastener 26 mounted therein may be moved slightly as necessary in order to center the second fastener 26 within an opening 22 in the equipment rack 12. After inserting the second fastener 26 into an opening 22 (FIGS. 1 and 2) in the equipment rack 12, the second fastener 26, mounting device 40, and electronic device 10 may be secured to the equipment rack 12 in any conventional manner, such as, for example, by rotating the second fastener 26 (which may be a thumbscrew, as noted above) in order to tighten it to the equipment rack 12, and, if desired, mounting a threaded nut (not shown) or the like onto the threaded portion 34 of the second fastener 26.

It should be noted that the retainer member 60 may be adapted to be positioned anywhere along the shaft 28, 32 of the first and second fastener 24, 26, including adjacent to the threaded portion 30, 34 thereof. However, the retainer member 60 is preferably positioned adjacent to the non-threaded portion 31, 33, FIG. 3, of the fastener shaft 28, 32 such that, when the retainer member 60 is in a "latched" mode, the fastener 24, 26 may be displaced in a linear direction "Z1" or "Z2" for a limited distance which is equal to the length of the non-threaded portion 31, 33 less the length of a completely compressed biasing device 80. As the fastener 24, 26 is displaced in a linear direction "Z1" or "Z2", the non-threaded portion 31, 33 of the fastener shaft 28, 32 may slide through the smaller diameter portion 68 (FIGS. 4 and 8–11) of the retainer member 60 within the limited distance discussed above. As noted above, the biasing device 80 biases the fastener 24, 26 in a linear direction "Z1" so that, when not secured to an equipment rack 12 (FIG. 1), most or all of the threaded portion 30, 34 of the fastener 24, 26 may be safely stored within the mounting member 42. In order to insert the second fastener 26 into an opening 22 (FIGS. 1 and 2) in the equipment rack 10 as described above, the second fastener 26 may be displaced toward the opening 22 in a linear direction "Z2", thereby compressing the biasing device 80. Rotating the second fastener 26 within the opening 22 in order to secure the second fastener 26 (and mounting device 40, etc.) to the equipment rack 10 further compresses the biasing device 80.

With reference also to FIGS. 1–11, FIG. 12 illustrates a method 100 of mounting an electronic device 10 having a first fastener 24 attached thereto to an equipment rack 12 adapted to receive a second fastener 26, wherein the first fastener 24 has a different thread type (e.g., thread diameter and/or length) than the second fastener 26. The method includes an initial step 102 of providing at least one mounting device 40 of the type described above. For each mounting device 40, the following steps are then completed. The next step 104 involves removing the first fastener 24 from the mounting member 42 of the mounting device 40. As noted above, this may be accomplished without removing the mounting device 40 from the electronic device 10 since the securing device 88, which does not utilize either fastener 24, 26, is adapted to secure the mounting member 42 to the electronic device 10. Thus, the securing device 88 remains on the mounting member 42 of the mounting device 40 as fasteners 24, 26 are removed from or inserted into the mounting member 42. Prior to performing the step 104 of removing the first fastener 24 from the mounting member 42, the retainer member 60 may be placed in an "unlatched" mode as described above and shown in dashed lines in FIG. 12.

The next step 106 involves inserting the second fastener 26 into the mounting member 42 of the mounting device 40. At any time subsequent to this step 106, the retainer member 60 may be placed in a "latched" mode as described above and shown in dashed lines in FIG. 12. The next step 108 involves inserting the second fastener 26 positioned within the mounting member 42 of the mounting device 40 into an opening 22 in the equipment rack 12. The final step 110 involves securing the second fastener 26 to the equipment rack 12, which may be accomplished by rotating the second fastener 26 (which may be a thumbscrew, as noted above) in order to tighten it to the equipment rack 12, and, if desired, mounting a threaded nut (not shown) or the like onto the threaded portion 34 of the second fastener 26.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

We claim:

1. A mounting device for securing an electronic device comprising at least one opening to an equipment rack comprising a plurality of openings, comprising:

a) a mounting member comprising at least one flange, an opening extending at least partially around the circumference of said mounting member, an end portion received within said at least one opening in said electronic device, and an inner cylindrical portion that receives one of at least a first fastener and a second fastener, said first fastener having a different thread type than said second fastener;

b) a retainer member that is received by said opening in said mounting member, said retainer member having a smaller diameter arcuate portion engaged with said first fastener or said second fastener in a latched mode which prevents one of said first fastener and said second fastener from being removed from said mounting member, and said retainer member having a larger diameter arcuate portion positioned adjacent to said first fastener or said second fastener in an unlatched mode which allows one of said first fastener and said second fastener to be removed from said mounting member through said larger diameter arcuate portion and the other of said first fastener or said second fastener to be inserted into said mounting member through said larger diameter arcuate portion while securely retaining said retainer member within said opening in said mounting member; and c) a securing device mounted on said end portion of said mounting member which secures said mounting member to said electronic device and allows either of said first fastener and said second fastener to be removed from said mounting member while securely retaining said mounting member within said at least one opening in said electronic device, and that facilitates floating movement of said mounting member within said at least one opening in said electronic device.

2. The mounting device of claim 1, said electronic device having a front surface and a rear surface, said mounting member further comprising:
   a) a first flange having a surface that abuts said front surface of said electronic device;
   b) a second flange having a surface that abuts said securing device;
   c) wherein said surface of said second flange is spaced away from said rear surface of said electronic device to provide a small gap between said surface of said second flange and said rear surface of said electronic device.

3. The mounting device of claim 1, said retainer member being a clip and further comprising a pair of resilient legs biased toward one another and connected by a flexible hinge.

4. The mounting device of claim 1, further comprising a biasing device positioned within said inner cylindrical portion of said mounting member.

5. The mounting device of claim 1, said securing device comprising a retainer ring mounted on and secured to said end portion of said mounting member.

6. A method of mounting an electronic device having a first fastener attached thereto to an equipment rack adapted to receive a second fastener, said first fastener having a different thread type than said second fastener, comprising:
   a) providing at least one mounting device, each mounting device comprising a mounting member that receives at least said first fastener or said second fastener;
   b) for each mounting device, securing said mounting member to said electronic device in a manner that allows either of said first fastener and said second fastener to be removed from said mounting member while securely retaining said mounting member within said at least one opening in said electronic device, and that facilitates floating movement of said mounting member within said at least one opening in said electronic device;
   c) for each mounting device, removing said first fastener from said mounting member without removing said mounting device from said electronic device;
   d) for each mounting device, inserting said second fastener into said mounting member;
   e) for each mounting device, inserting said second fastener positioned within said mounting member into an opening in said equipment rack;
   f) for each mounting device, securing said mounting device with said second fastener therein to said equipment rack;
   g) for each mounting device, prior to removing said first fastener from said mounting member, placing said retainer member in said unlatched mode while securely retaining said retainer member within said mounting member, whereby said first fastener may be linearly removed from said mounting member; and
   h) for each mounting device, subsequent to inserting said second fastener into said mounting member, placing said retainer member in said latched mode whereby said second fastener may not be linearly removed from said mounting member.

\* \* \* \* \*